United States Patent [19]
Moreland

[11] Patent Number: 5,673,047
[45] Date of Patent: Sep. 30, 1997

US005673047A

[54] GAIN-COMPENSATING DIFFERENTIAL REFERENCE CIRCUIT

[75] Inventor: Carl W. Moreland, Greensboro, N.C.

[73] Assignee: Analog Devices, Inc., Norwood, Mass.

[21] Appl. No.: 465,885

[22] Filed: Jun. 6, 1995

[51] Int. Cl.[6] .................................................. H03M 1/18
[52] U.S. Cl. ............................................................. 341/139
[58] Field of Search .................................... 341/139, 163, 341/118, 119, 120, 121

[56] References Cited

U.S. PATENT DOCUMENTS 4,490,713 12/1984 Mrozowski et al. ..................... 341/163

Primary Examiner—Brian K. Young
Attorney, Agent, or Firm—Hale and Dorr LLP

[57] ABSTRACT

A gain compensating differential reference circuit that is used to match the gain of an input differential amplifier, and track and hold circuit at the input of an analog-to-digital converter. The gain compensating differential reference circuit includes a single-to-differential converter to convert a $V_{REF}$ signal into a $V_{REF+}$ and a $V_{REF-}$ signals whose difference equals the full-scale range of the differential analog input to the A/D converter, a gain matching differential amplifier to process to the differential output of the single-to-differential converter, and a gain matching track and hold circuit to process the output of the differential amplifier. The output of the gain matching track and hold circuit has the same gain and full-scale range as the analog signals processed by the input circuitry of the A/D converter along the analog path.

24 Claims, 4 Drawing Sheets

GAIN-COMPENSATING DIFFERENTIAL REFERENCE CIRCUIT

FIELD OF THE INVENTION

The present invention relates to analog-to-digital converters. More specifically, the present invention relates to gain-compensating reference circuits that may be used with high speed analog-to-digital converters.

BACKGROUND OF THE INVENTION

There are a variety of analog-to-digital ("A/D") converters. For example, there are parallel encoder (or flash) A/D converters, serial-type A/D converters, successive approximation A/D conveners, voltage-to-frequency A/D converters, dual-ramp A/D converters, and staircase A/D converters. In many A/D converters, the circuit configuration includes processing circuitry for the analog input signal such as a high-impedance buffer or a track-and-hold amplifier. Many A/D converters also employ a reference circuit to set the full scale range of the A/D converter. This reference circuit typically accepts an input reference voltage, such as a bandgap voltage, and biases the internal conversion circuitry of the A/D converter.

The bias levels that are set by the reference circuit are what set the full-scale range of the A/D converter. A primary concern is matching the full-scale range of the A/D converter with the full-scale range of the signal that is applied to the conversion circuit by the input processing circuit. Therefore, it is important to account for processing errors, such as gain and offset errors, in the input processing circuit as well as the reference circuit. Typically, these circuits are of substantially different designs and results in overall A/D converter gain errors, which may vary with temperature.

It is desirable to have a reference circuit that will match and track the gain of the input processing circuit so that the overall gain of the A/D converter will remain constant. Furthermore, making the reference circuit match the input processing circuit can substantially simplify the design of the input processing circuit as gain accuracy is no longer critical. This is especially important in high-speed A/D converters where gain compensation circuitry can degrade performance and speed. Shifting the gain compensation from the input processing circuit to the reference circuit results in better high-speed dynamic performance since it has no dynamic operating mode. This lack of a dynamic operating mode makes such compensation much easier since closed-loop circuits may be used with no performance penalty.

SUMMARY OF THE INVENTION

The present invention is a gain compensating reference circuit whose gain matches and tracks the gain of the input processing circuit in order to maintain overall gain accuracy in the A/D converter.

The gain compensating reference circuit of the present invention includes a single-to-differential ("S/D") conversion circuit to convert the single-ended input reference voltage, $V_{REF}$, into a differential voltage, which is represented by the following expression:

$$V_{REFd} = V_{REF+} - V_{REF-}$$

This differential reference should equal the full-scale range of the differential signal that is applied to the input of the A/D converter, $V_{INd}$. In some cases the A/D converter accepts a single-ended analog input and converts it internally to a differential signal $V_{INd}$ by means of a S/D conversion circuit. In this case, the reference S/D conversion circuit can be made with substantially similar transfer characteristics such that errors in the analog S/D circuit are compensated for with like errors in the reference S/D circuit.

The differential output of the S/D converter is input to a gain matching circuit whose transfer characteristics match and track the transfer characteristics of the input signal processing circuit. In particular, the gain matching circuit will process the differential reference voltages under substantially the same conditions so that the difference in the voltages at the output of the gain matching amplifier ($V_{REFd}$) will match the signal range at the output of the input signal processing circuit ($V_{INd}$). In the case where the input processing circuit includes a track-and-hold function, the reference gain matching circuit may also include the track-and-hold switching circuitry to accurately reflect its dynamic errors in the reference path.

In some A/D converters, it is necessary to change the differential output voltage of the gain matching amplifier back to a single-ended format for the converter bias circuit. This can be achieved with a differential-to-single ("D/S") conversion circuit. The transfer characteristics of the D/S conversion circuit can be made to pre-compensate for errors in the internal A/D biasing circuitry.

DETAILED DESCRIPTION OF THE DRAWINGS

The present invention is a gain compensating differential reference circuit that may be used in an A/D converter. The circuit of the present invention may be used to generate a gain matched differential bias signal that is applied to the conversion circuitry of an A/D converter. The differential bias signal that is applied has the same full-scale range as the differential analog inputs that are input thereto after being processed by the input circuitry along the analog path.

Figure 1:
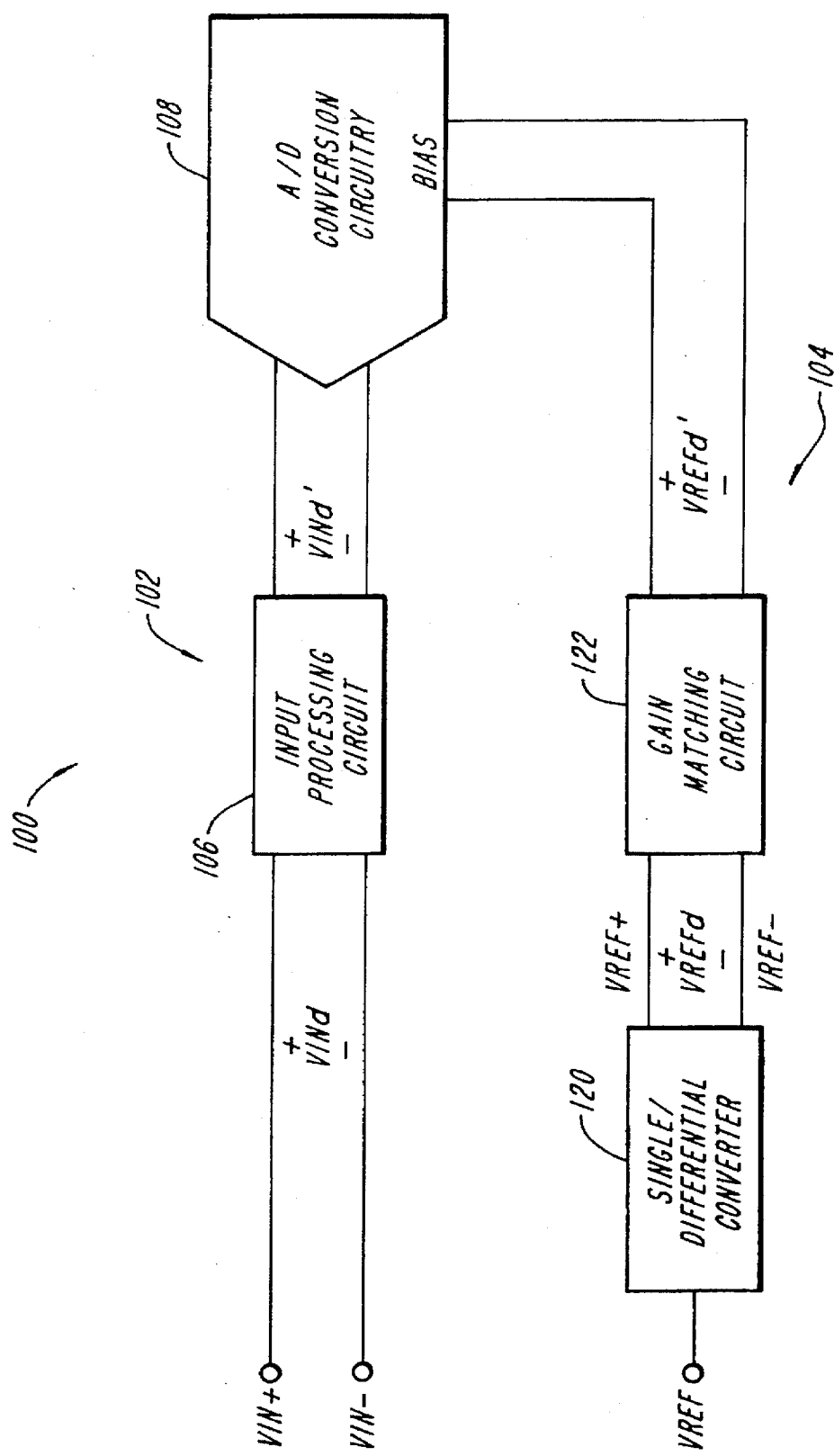
FIG. 1 is a block diagram of an embodiment of an A/D converter and associated circuitry, and a gain compensating differential reference circuit for providing a differential bias input to the A/D conversion circuitry

Referring to FIG. 1 at 100, circuitry of an A/D converter is shown along with the gain compensating differential reference converter according to a first embodiment of the present invention. A/D circuitry 102 includes input processing circuit 106 and A/D conversion circuitry 108. The differential input signal $V_{INd}$ is determined by the following expressions:

$$V_{INd} = V_{IN+} - V_{IN-}$$

A differential input, $V_{INd}$, is input to input processing circuitry 106. Input processing circuit 106 has certain predetermined transfer characteristics which will provide a differential subpart, $V_{INd}'$. The input processing circuit may provide gain to provide a differential output that is set at full range. This differential output will include processing errors, such as gain and offset errors, caused by input processing circuit 106. The differential output, $V_{INd}'$, is input to A/D conversion circuitry 108. The gain compensating reference circuitry of the present invention is shown at 104. Circuit 104 includes single/differential (S/D) converter 120 which converts the single-ended input reference voltage, $V_{REF}$, into a differential voltage, $V_{REFd}$. This differential voltage is represented by the expression:

$$V_{REFd} = V_{REF+} - V_{REF-}$$

This differential signal should equal the full-scale range of the differential signal $V_{INd}$ that is input to A/D converter circuitry 102.

The differential output $V_{REFd}$ of S/D converter is input to gain matching circuit 122, which has transfer characteristics that match and track the transfer characteristics of input signal processing circuit 106. Gain matching circuit 122 processes differential reference signal $V_{REFd}$ under substantially the same conditions as input processing circuit 106. This results in a range for $V_{REFd}$ that is output from gain matching circuit 122 that matches the range of the differential signal, $V_{INd}$, that is output from input signal processing circuit 106. As will be shown in FIGS. 2 and 3, when input processing circuit 106 includes other circuitry, gain matching circuit 122 may also include such circuitry to accurately reflect its dynamic errors in the reference path. The differential output $V_{REFd}'$ of gain matching circuit 122 is the differential bias signal to A/D conversion circuitry 108.

Figure 2:
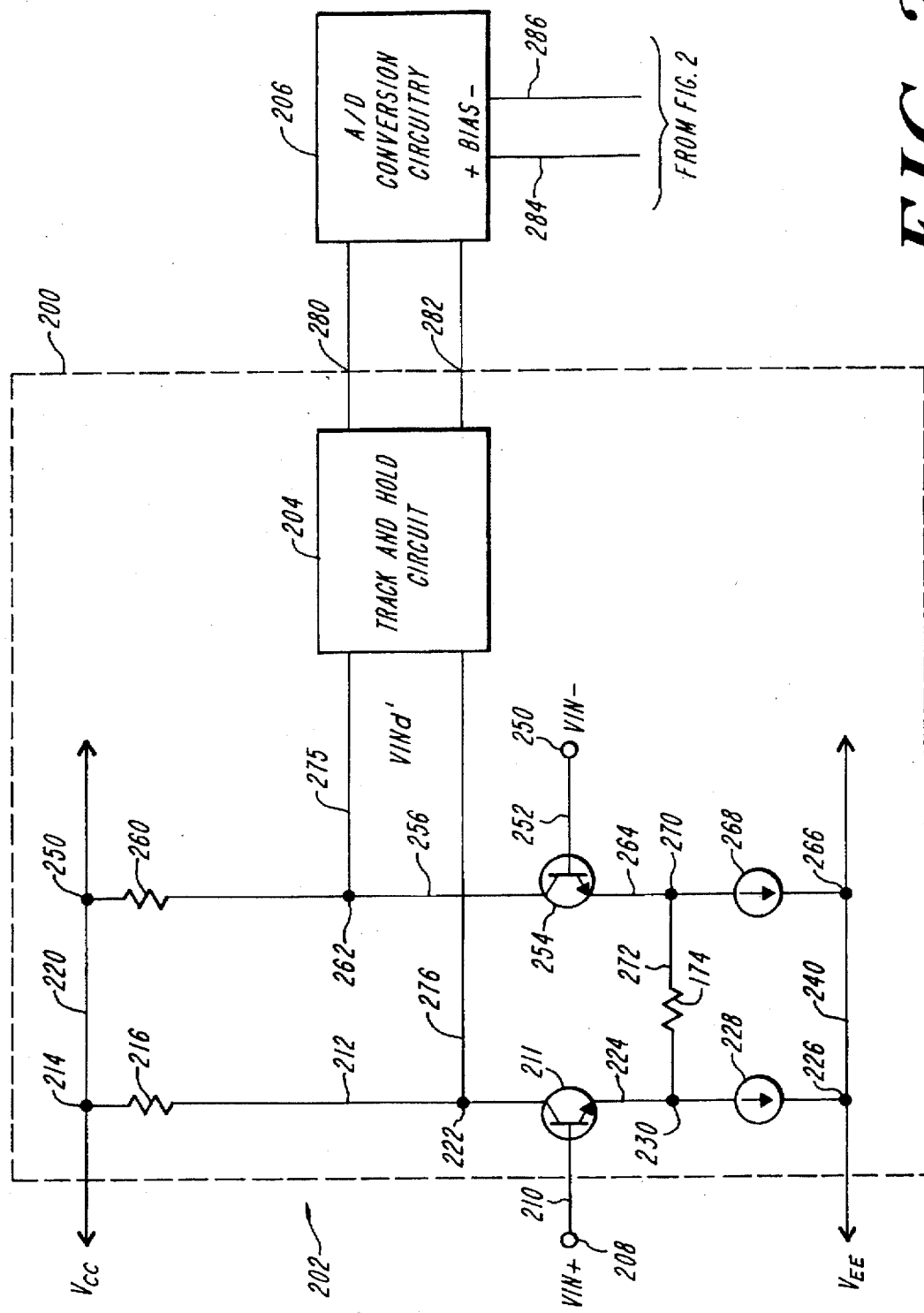
FIG. 2 is a schematic and block diagram of an embodiment of the A/D converter that uses a reference voltage to input to the conversion circuitry.

Referring to FIG. 2, typical input circuitry 200 of a high-speed A/D converter may include differential input amplifier 202 and additional circuitry, such as track and hold circuit 204. The differential analog input to be converted is input at the $V_{IN+}$ input at 208 and the $V_{IN-}$ input at 250. The differential input transistor pair of differential input amplifier 202 are bipolar npn transistors 211 and 254. The $V_{IN+}$ input at 208 connects to the base of transistor 211 via line 210 and the $V_{IN-}$ input at 250 connects to the base of transistor 254 via line 252. These signals result in differential input $V_{INd}$ as shown in FIG. 1.

With regard to transistor 211, line 212 connects the collector of transistor 111 to $V_{CC}$ 220 at node 214. Load resistor 216 is disposed in line 212 and node 222 is disposed in line 212 between load resistor 216 and transistor 211. Line 224 connects the emitter of transistor 211 to $V_{EE}$ 240 at node 226. Current source 228 is disposed in line 224 and node 230 is disposed in line 224 between current source 228 and transistor 211.

Now with regard to transistor 254, line 256 connects the collector of transistor 254 to $V_{CC}$ 220 at node 250. Load resistor 260 is disposed in line 256 and node 262 is disposed in line 256 between load resistor 260 and transistor 254. Line 264 connects the emitter of transistor 254 to $V_{EE}$ 240 at node 266. Current source 268 is disposed in line 264 and node 270 is disposed in line 264 between current source 268 and transistor 254.

Line 272 connects node 230 in line 224 and node 270 in line 264. Resistor 274 is disposed in line 272. Differential input amplifier 202 operates conventionally and provides a predetermined amount of gain to the differential input $V_{INd}$ to generate the differential signal $V_{INd}'$.

Node 222 in line 212 between transistor 211 and load resistor 216 has output line 276 connected to it. Node 262 in line 256 between transistor 252 and load resistor 260 has output line 275 connected to it. The differential signals on lines 276 and 275 that are output from differential input amplifier 202 are input to track and hold circuit 204. The track and hold circuit tracks the signals and holds them while the conversion is taking place.

Processing of the analog input signals by differential input amplifier 202 and track and hold circuit 204 may result in gain and offset errors. These errors can cause a mismatch between the full-scale range set by the associated reference voltage and the full-scale range of the analog input signals, $V_{IN+}$ and $V_{IN-}$. This mismatch results in inaccuracy in conversion.

Figure 3:
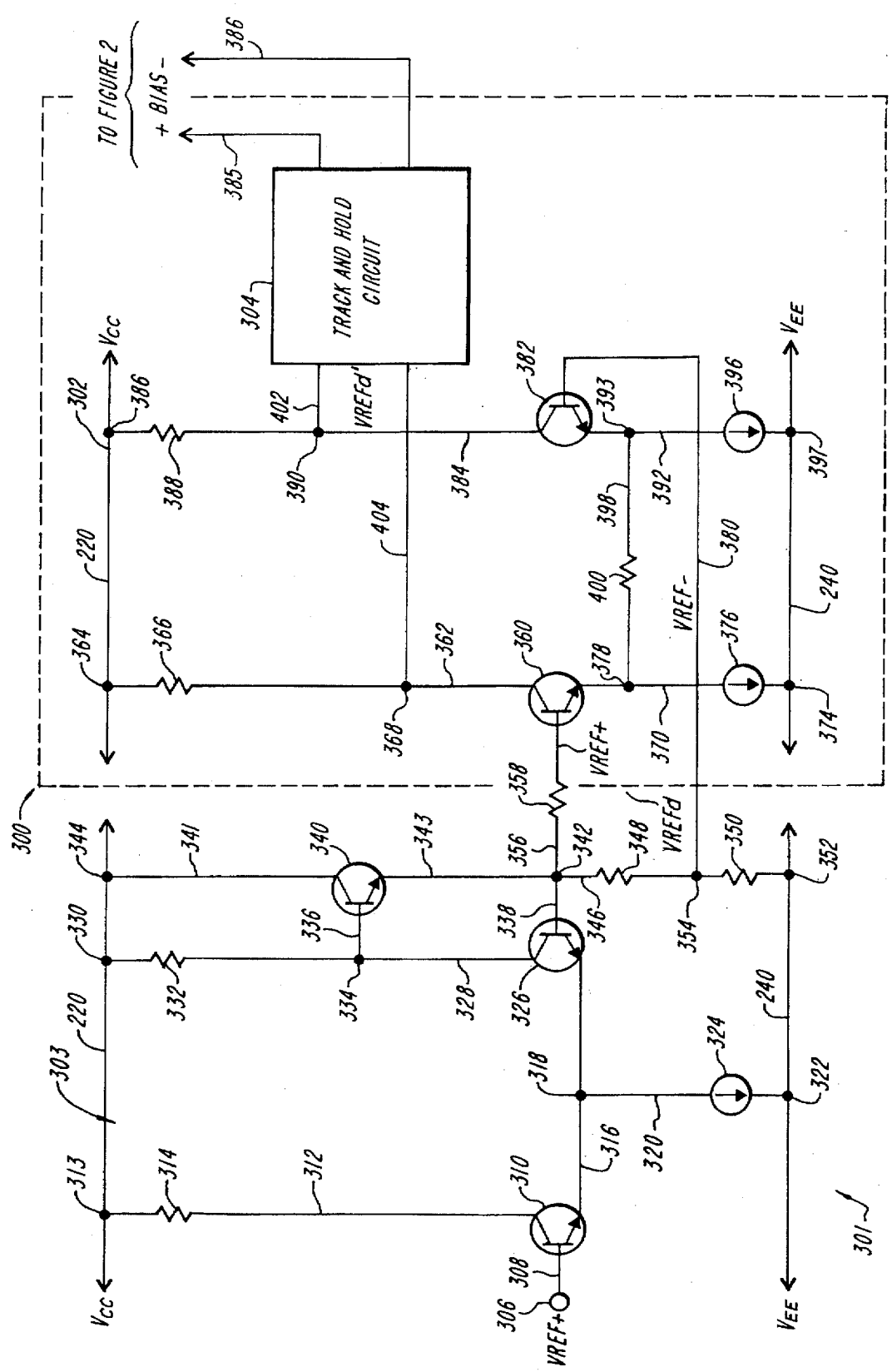
FIG. 3 is a schematic and block diagram of an embodiment of the gain compensating differential reference circuit that provides a differential bias input to the conversion circuitry shown in FIG. 1.

Referring to FIG. 3, the gain compensating differential reference circuit of the present invention is shown generally at 300. The gain compensating differential reference circuit includes single-to-differential (S/D) converter 301, gain matching amplifier 302, and track and hold circuit 304. These elements are selected to emulate the processing of the differential analog input to the analog path. The result will be that the differential reference voltage, $V_{REFd}'$, that is conditioned in the same manner as the differential analog input $V_{INd}$ on the analog path, which represents gain matching.

S/D converter 301 has $V_{REF}$ input 306 to which the $V_{REF}$ signal is applied. Line 308 connects the $V_{REF}$ signal to the base of bipolar npn transistor 310. Line 312 connects the collector of transistor 310 to $V_{CC}$ 220 at node 313. Load resistor 314 is disposed in line 312.

The second input transistor of the differential input pair is bipolar npn transistor 326. The base of transistor 326 connects to node 342 via line 338. Line 328 connects the collector of transistor 326 to $V_{CC}$ 220 at node 230. Load resistor 332 is disposed in line 328. Node 334 is disposed in the line 328 below load resistor 332.

Line 316 connects the emitters of transistors 310 and 326. Node 318 is disposed in line 316. Line 320 connects node 318 to $V_{EE}$ 240 at node 322. Current source 324 is disposed in line 320.

Line 336 connects node 334 to the base of output bipolar npn transistor 340. The collector of transistor 340 connects to line 341 that connects to the $V_{CC}$ 220 at node 344, and the emitter of transistor 340 connects to node 342 via line 343. As such, the emitter current is applied to the base of transistor 326, which is one of the differential input transistors.

Line 346 connects node 342 to $V_{EE}$ 240 at node 352. Line 346 includes resistors 348 and 350. Node 354 is disposed in line 346 between the two resistors. Line 346 with resistors 348 and 350 forms a voltage divider for generating the full-scale range from the $V_{REF}$ signal. The two resistors are selected such that the desired full-scale range may be set to a predetermined level for developing the differential signal $V_{REFd}$, which is input to gain matching amplifier 302.

Line 356 connects node 342 to the base of bipolar npn transistor 360 of gain matching amplifier 302. Resistor 358 disposed in line 356 generates the appropriate base current offset for transistor 360 to match the offset generated by transistor 382. Line 380 connects node 354 to the base of bipolar npn transistor 382. Transistors 360 and 382 are the differential input transistors for gain matching amplifier 302 and to which $V_{REFd}$ is applied.

Now referring specifically to gain matching amplifier 302, line 362 connects the collector of transistor 360 to $V_{CC}$ 220 at node 364. Load resistor 366 is disposed in line 362 and node 368 is disposed in line 362 below resistor 366. Line 370 connects the emitter of transistor 360 to $V_{EE}$ 240 at node 374. Current source 376 is disposed in line 370 and node 378 is disposed in line 370 above current source 376.

Line 384 connects the collector of transistor 382 to $V_{CC}$ 220 at node 386. Load resistor 388 is disposed in line 384 and node 390 is disposed in line 387 below resistor 388. Line 392 connects the emitter of transistor 382 to $V_{EE}$ at node 397. Current source 396 is disposed in line 392 and node 393 is disposed in line 392 above current source 396. Line 398 connects between node 378 in line 370 and node 393 in line 392. Resistor 400 is disposed in line 398. This differential amplifier operates conventionally and provides a predetermined amount of gain to the differential input $V_{REFd}$ to generate the differential signal $V_{REFd}'$.

Differential signal $V_{REFd}'$ from gain matching amplifier 202 consists of the signal on line 402 that connects to node 390 in line 384 and the signal on line 404 that connects to node 368 in line 362. These output signals are input to gain matching track and hold circuit 304 which operates conventionally (like track and hold circuit 204 in FIG. 2). The signals output by track and hold circuit 304 on lines 385 and 386 are input to conversion circuitry 206 in FIG. 2. These signal have experienced the same gain changing conditions as the signals output from track and hold circuit 204 along the analog path so the signals input to conversion circuitry 206 from track and hold circuit 204 and track and hold circuit 304 have the same full-scale range. As such, proper conversion can take place.

Figure 4:
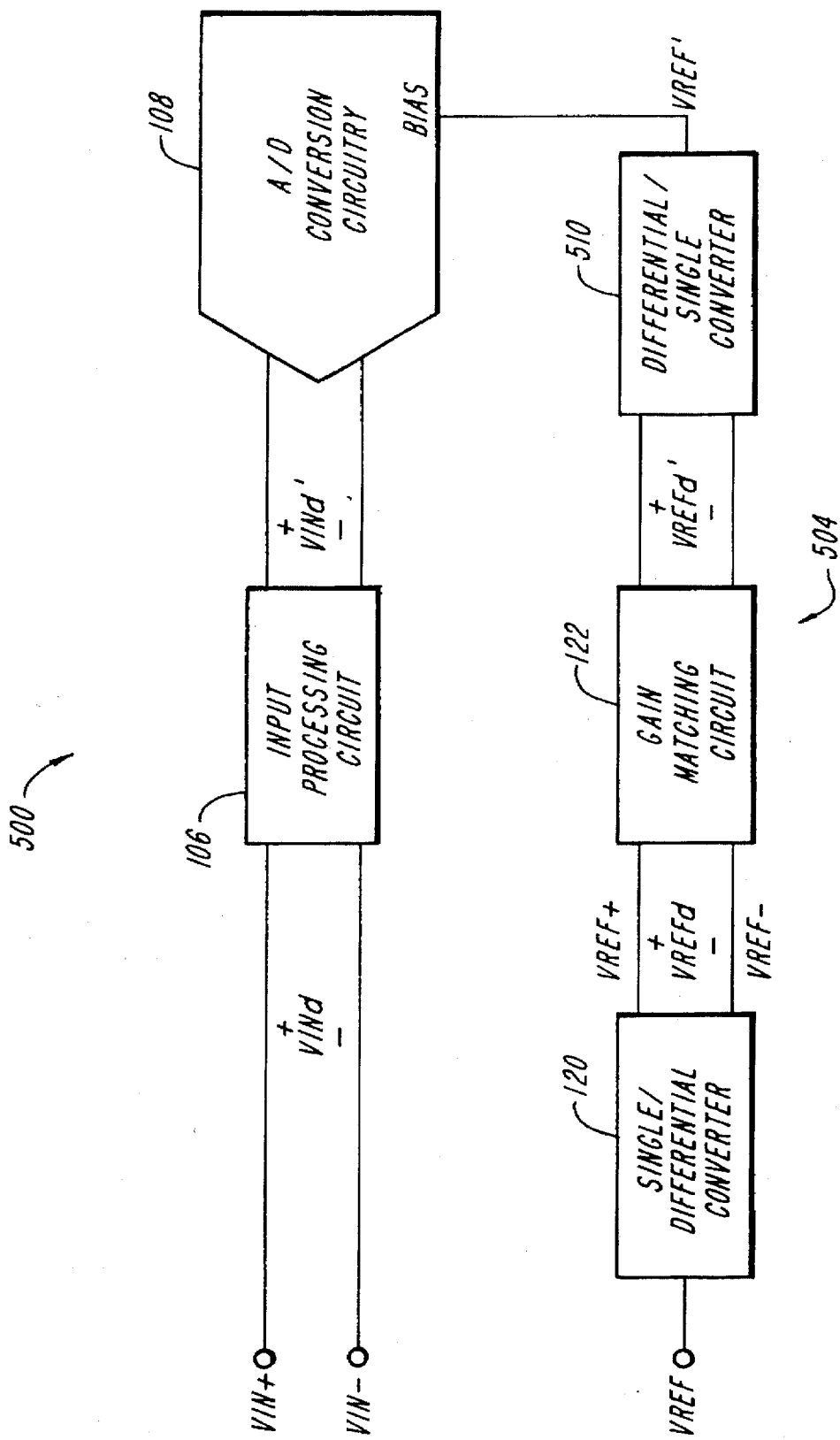
FIG. 4 is a block diagram a second embodiment of an A/D converter and a gain compensating differential reference circuit for providing a differential bias input to the A/D conversion circuitry.

Referring to FIG. 4, a second embodiment of the gain matching circuitry of the present invention is shown generally at 500. The circuit in FIG. 4 has on analog path that is the same as the circuit shown in FIG. 1. As such, the elements of that path have the same reference numbers. Therefore, the differential input $V_{INd}$ is provided to input processing circuitry 106, which processes the differential signal to generate $V_{INd}'$ at its output. Differential signal $V_{INd}'$ is input to A/D conversion circuitry 108.

Gain compensating differential reference circuitry 504 is similar to gain compensating differential reference circuit 114 in FIG. 1 except that it also includes differential/single ("D/S") converter 510. D/S converter 510 is used to generate reference signal $V_{REF}'$ from differential signal $V_{REFd}'$. This is done because some A/D converters require a bias signal with a single-ended format. Except for this, differential gain compensating reference circuitry 504 will match and track input processing circuitry 106.

The terms and expressions that are used herein are terms of expression and not of limitation. There is no intention in the use of such terms and expressions of excluding the equivalents of the features shown and described, or portions thereof, it being recognized that various modifications are possible in the scope of the invention.

I claim:

1. A compensating circuit for compensating for gain changes in a processing circuit, with the gain compensating circuit generating an output with a full-scale range substantially the same as an output of the processing circuit, comprising:

voltage reference source for generating an output that is a voltage reference at a predetermined level; and a first input circuit that receives as an input the output of the voltage reference source, with the first input circuit having gain setting means to match the gain of an input circuit of the processing circuit, the first input circuit generating an output with substantially a same gain as an output of the input circuit of the processing circuit.

2. The compensating circuit of claim 1, further comprising a first latch connected to the output of the first input circuit for latching the value at the output of the first input circuit, with the output of the first latch having a gain adjustment substantially the same as a gain adjustment to the output of the input circuit of the processing circuit.

3. The compensating circuit as recited in claim 2, wherein the voltage reference source generates an output voltage reference at a level that is capable of being converted to a differential signal with a full-scale range substantially the same as the full-scale range of the signal input to the input circuit of the processing circuit.

4. The compensating circuit as recited in claim 2, wherein the input circuit includes a single-to-differential conversion circuit for converting a single-ended output of the voltage reference source to a differential output with a same full-scale range as a differential signal input to the input circuit of the processing circuit.

5. The compensating circuit as recited in claim 4, wherein the input circuit further includes a differential amplifier, wherein the differential output of the conversion circuit is input to the differential amplifier, with the differential amplifier generating a differential output with substantially the same gain as a differential output of the input circuit of the processing circuit.

6. The compensating circuit as recited in claim 2, wherein the first latch includes a track and hold circuit.

7. The compensating circuit as recited in claim 2, wherein the output of the first latch is a differential output, with a gain and full-scale range substantially the same as the gain and full-scale range as a differential output of the latch of the processing circuit.

8. The compensating circuit as recited in claim 1, wherein the voltage reference source generates an output voltage reference at a level that is capable of being converted to a differential signal with a full-scale range substantially the same as the full-scale range of the signal input to the input circuit of the processing circuit.

9. The compensating circuit as recited in claim 1, wherein the first input circuit includes a single-to-differential conversion circuit for converting a single-ended output of the voltage reference source to a differential output with a same full-scale range as a differential signal input to the input circuit of the processing circuit.

10. The compensating circuit as recited in claim 9, wherein the first input circuit including a differential amplifier, and wherein the differential output of the conversion circuit is input to the differential amplifier, with the differential amplifier generating a differential output with substantially the same gain as a differential output of the input circuit of the processing circuit.

11. A compensating circuit for compensating for gain changes in a processing circuit, with the gain compensating circuit generating an output with a full-scale range substantially the same as an output of the processing circuit, comprising:

voltage reference source for generating a single-ended output that is a voltage reference at a predetermined level;

a conversion circuit for converting the single-ended output of the voltage reference source to a differential output with a same full-scale range as a differential signal input to an input circuit of the processing circuit; and a differential amplifier that receives the differential output of the conversion circuit, with the differential amplifier generating a differential output with substantially the same gain as a differential output of an input circuit of the processing circuit.

12. The compensating circuit as recited in claim 11, wherein the voltage reference source generates an output voltage reference at a level that is capable of being converted to a differential signal with a full-scale range substantially the same as the full-scale range of the signal input to the input circuit of the processing circuit.

13. A circuit comprising:

an analog-to-digital (A/D) converter;

an input processing circuit for receiving an input signal and for providing to the A/D converter an amplified output signal with a gain;

a gain matching circuit for receiving as an input a reference voltage, and for providing to the A/D converter an output signal with substantially the same gain as that of the amplifier output signal from the input processing circuit.

14. The circuit of claim 13, wherein the gain matching circuit includes a latch at the output of the gain matching circuit for latching the value at the output of the gain matching circuit.

15. The circuit of claim 13, wherein the reference voltage matches the full scale range of the voltage signal from the input processing circuit to the A/D converter.

16. The circuit of claim 13, wherein the gain matching circuit includes a single to differential converter for receiving a reference voltage as a single-ended signal and for converting the single-ended signal to a differential signal.

17. The circuit of claim 16, wherein the gain matching circuit includes a differential amplifier for receiving the differential signal and a track and hold circuit for receiving the amplified voltage reference signal and for providing the output signal to the A/D converter.

18. The circuit of claim 13, wherein the gain matching circuit includes a differential to single converter so that the output signal to the A/D converter is a single-ended signal.

19. A method compensating for gain changes in a processing circuit having an input circuit for providing an amplified signal to the processing circuit with a gain, the method comprising the steps of:

receiving as an input a voltage reference signal; and matching the gain of the input circuit of the processing circuit and generating an output signal with substantially a same gain as an output of the input circuit of the processing circuit.

20. The method of claim 18, further comprising a step of latching the output signal to the processing circuit.

21. The compensating circuit of claim 11, further comprising a first latch connected to the differential output of the differential amplifier for latching the value at the output of the differential amplifier, with a differential output of the first latch being a differential output having a gain adjustment substantially the same as a gain adjustment to a differential output of the input circuit of the processing circuit processed by a latch of the processing circuit.

22. The compensating circuit as recited in claim 21, wherein the voltage reference source generates an output voltage reference at a level that is capable of being converted to a differential signal with a full-scale range substantially the same as the full-scale range of the signal to the input circuit of the processing circuit.

23. The compensating circuit as recited in claim 21, wherein the first latch includes a track and hold circuit.

24. The compensating circuit as recited in claim 21, wherein the output of the latch has a full-scale range substantially the same as the full-scale range as a differential output of the, input circuit of the processing circuit.

* * * * *